United States Patent [19]

Slivka et al.

[11] Patent Number: 5,455,577

[45] Date of Patent: Oct. 3, 1995

[54] METHOD AND SYSTEM FOR DATA COMPRESSION

[75] Inventors: Benjamin W. Slivka, Clyde Hill; Richard F. Rashid, Woodinville, both of Wash.

[73] Assignee: Microsoft Corporation, Redmond, Wash.

[21] Appl. No.: 31,189

[22] Filed: Mar. 12, 1993

[51] Int. Cl.$^6$ .................................................. H03M 7/30
[52] U.S. Cl. ............................................................ 341/51
[58] Field of Search .................................. 341/51, 64, 65, 341/67, 87, 90; 364/200, 260.6, 513.5, 148; 370/83, 84

[56] References Cited

U.S. PATENT DOCUMENTS

| | | | |
|---|---|---|---|
| 4,021,782 | 5/1977 | Hoerning | 340/172.5 |
| 4,464,650 | 8/1984 | Eastman et al. | 340/347 DD |
| 4,701,745 | 10/1987 | Waterworth | 340/347 DD |
| 4,730,348 | 3/1988 | MacCrisken | 375/122 |
| 4,814,746 | 3/1989 | Miller et al. | 341/95 |
| 4,906,991 | 3/1990 | Fiala et al. | |
| 5,016,009 | 5/1991 | Whiting et al. | 341/67 |
| 5,155,484 | 10/1992 | Chambers, IV | 341/55 |

OTHER PUBLICATIONS

James A. Storer et al., "Data Compression via Textual Substitution", *Journal of the Asociation for Computing Machinery*, vol. 29, No. 4, Oct. 1982, pp. 928–951.

Tescher, P. "A Modified Lempel–Ziv–Welch Data Compression Scheme" (1987), Australian Computer Science Communications, 9(1), 262–272.

Bell, Timothy, et al., *Text Compression*, Prentice Hall, New Jersey, 1990, pp. 214–243, 303–310.

Bell, Tim, "Longest Match String Searching for Ziv–Lempel Compression," Submitted to Workshop on Algorithms and Data Structures, Carleton University, Canada, 1989.

Bell, Timothy, "A Unifying Theory and Improvements for Existing Approaches to Text Compression," doctoral dissertation, University of Canterbury, Christchurch, New Zealand, 1986.

Bell, Timothy, "Better OPM/L Text Compression," *IEEE Transactions on Communications*, vol. 34, No. 12, Dec. 1986, pp. 1176–1182.

Bell, Timothy, et al., "Modeling for Text Compression," *ACM Computing Surveys*, vol. 21, No. 4, Dec. 1989, pp. 557–591.

Brent, R. P., "A Linear Algorithm for Data Compression," *The Australian Computer Journal*, vol. 19, No. 2 May 1987, pp. 64–68.

Chambers, Lloyd, "Fast Data Compressor With Direct Lookup Table Indexing Into History Buffer," Software Source Code Appendix, Salient Software, Inc., 1991, pp. A1–A10.

(List continued on next page.)

*Primary Examiner*—Brian K. Young
*Attorney, Agent, or Firm*—Seed and Berry

[57] ABSTRACT

A method and system for compressing a stream of bytes in a compression system. The compression system has a search data structure containing slots for identifying the position of occurrences of byte sequences in an input stream. A byte sequence is retrieved from the input stream. The method then determines whether the search data structure contains a slot identifying the position of a byte sequence that matches the retrieved byte sequence. If the search data structure contains a slot which identifies a matching byte sequence, then the contents of a search data structure slot containing the match is replaced with the position of the retrieved byte sequence. If the search data structure does not contain a slot identifying a matching byte sequence, then a slot is selected using a least recently updated slot algorithm. The contents of this least recently updated slot are then replaced with the position of the retrieved byte sequence. When a matching byte sequence is determined, an indicator of the position identified in the slot before replacement is output. If no matching byte sequence is determined, then a byte of the retrieved byte sequence is output.

12 Claims, 7 Drawing Sheets

OTHER PUBLICATIONS

Cleary, John G., and Witten, Ian H., "Data Compression Using Adaptive Coding and Partial String Matching," *IEEE Transactions on Communications*, vol. 32, No. 4, Apr. 1984, pp. 396–402.

Fiala, Edward R., and Greene, Daniel H., "Data Compression With Finite Windows," *Communications of the ACM*, vol. 32, No. 4, Apr. 1989, pp. 490–505.

Fiala, Edward R., Greene, Daniel H., "CompressImpl.mesa" and CompressImpl4KUF.mesa, Xerox Corp., 1984, pp. 1–18.

Horspool, R. Nigel, and Cormack, Gordon V., "A General–Purpose Data Compression Technique With Practical Computer Applications," *CIPS Session 84*, 1984, pp. 138–141.

Lempel, Abraham, and Ziv, Jacob, "On the Complexity of Finite Sequences," *IEEE Transactions on Information Theory*, vol. 22, No. 1, Jan. 1976, p. 75–81.

Storer, James A., and Szymanski, Thomas G., "The Macro Model for Data Compression," *Tenth Annual ACM Symposium on Theory of Computer*, 1978, pp. 30–39.

Welch, Terry A., "A Technique for High–Performance Data Compression," *Computer*, Jun. 1984, pp. 8–19.

Ziv, Jacob, "Coding Theorems for Individual Sequences," *IEEE Transactions on Information Theory*, vol. 24, No. 4, Jul. 1978, pp. 405–412.

Witten, Ian H., et al., "Compress and Compact Discussed Further," *Communications of the ACM, Technical Correspondence*, vol. 31, No. 9, Sep, 1988, pp. 1139–1140, 1145.

Ziv, Jacob, "On Universal Quantization," *IEEE Transactions on Information Theory*, vol. 31, No. 3, May 1985, pp. 344–347.

Ziv, Jacob, and Lempel, Abraham, "A Universal Algorithm for Sequential Data Compression," *IEEE Transactions on Information Theory*, vol. 23, No. 3, May 1977, pp. 337–343.

METHOD AND SYSTEM FOR DATA COMPRESSION

TECHNICAL FIELD

This invention relates generally to a method and system for data compression, and more particularly to a method and system for compressing data using LZ77-based compression.

BACKGROUND OF THE INVENTION

A variety of data compression algorithms derive from work published in Ziv, Jacob and Lempel, Abraham, "A Universal Algorithm for Sequential Data Compression," IEEE Transactions on Information Theory 23(3):337–343, May 1977. These algorithms are commonly referred to as LZ77 compression schemes. LZ77 compression schemes are based on the principle that repeated strings of characters can be replaced by a pointer to the earlier occurrence of the string. A pointer is typically represented by an indication of the position of the earlier occurrence (typically an offset from the start of the repeated string) and the number of characters that match (the length). The pointers are typically represented as <offset, length> pairs. For example, the following string "abcdabcdacdacdacdaeaaaaaa"

may be represented in compressed form by the following

"abcd<4,5><3,9>ea<1,5>"

Since the characters "abcd" do not match any previous character, they are encoded as a raw encoding. The pair <4,5> indicates that the string starting at an offset of 4 and extending for 5 characters is repeated "abcda". The pair <3,9> indicates that the string starting at an offset of 3 and extending for 9 characters is repeated.

Compression is achieved by representing the repeated strings as a pointer with fewer bits than it would take to repeat the string. Typically, a single byte is not represented as a pointer. Rather, single bytes are output with a tag bit indicating single byte encoding followed by the byte. The pointers are differentiated from a single byte encoding by different tag bit value followed by the offset and length. The offset and length can be encoded in a variety of ways.

The efficiency of a compression technique can be measured by the time it takes to compress data and the time it takes to decompress the data. Another measure of efficiency is the amount of actual data compression that occurs. Generally, time of compression and amount of compression are inversely proportional. Various compression techniques have been developed in attempts to reach an optimal balance between time and amount of compression for a given situation. The book "Text Compression" by Bell, Cleary, and Witten, published by Prentice Hall, provides an overview of various text compression techniques and is hereby incorporated by reference. The time of compression for LZ77-based schemes is dependent primarily on the time needed to determine whether a given string is a repeat of an earlier string, generally referred to as string searching. It would be desirable to have a data compression system that minimizes the time of compression while allowing a considerable amount of compression. It would be desirable to have an encoding scheme that minimizes the number of bits needed for offset and length encodings.

SUMMARY OF THE INVENTION

It is an object of the present invention to provide a method and system for compressing a stream of data using an LZ77-based scheme.

It is another object of the present invention to provide a method and system for reducing the amount of time needed to search for repeated strings.

These and other objects of the present invention, which will become apparent as the invention is more fully described below, are provided by method and system for data compression. In a preferred embodiment, a stream of bytes is compressed using a search data structure that stores entries containing the identification of the position of previously occurring strings in the stream. The preferred compression system selects a current string and determines whether the search data structure contains an entry identifying a matching string. If such an entry is found, the compression system determines the maximum length of the match and outputs an offset and length encoding of the match. The compression system then updates the entry to identify the position of the current string. If no such entry is found, the compression system outputs a single byte encoding and selects an entry in the search data structure that represents a least recently updated entry. The compression system overwrites the least recently updated entry with the identification of the position of the current string.

DETAILED DESCRIPTION OF THE INVENTION

The present invention provides a method and system for compressing an input stream of data into a compressed stream of data using an LZ77-based encoding. The present invention also provides a method and system for decompressing a compressed stream encoded using an LZ77-based encoding. In a preferred embodiment, as the compression system compresses the input stream, it maintains a search data structure. The search data structure contains entries that identify the position within the input stream of byte sequences (strings) that have already been encountered. The compression system searches the search data structure to determine whether it contains an entry that identifies a previous occurrence of a byte sequence that matches a current byte sequence. When the search data structure contains such an entry, the compression system encodes the current byte sequence as an offset to the matching byte sequence and the length of the match. The compression system replaces the determined entry with an entry that identifies the current byte sequence. When the search data structure does not contain such an entry, the compression system encodes the first byte of the current byte sequence as a single byte encoding. The compression system then selects an entry that was least recently updated when no matching entry was found (least recently updated) and replaces the selected entry with an entry that identifies the current byte sequence.

Figure 1:
FIG. 1 is an overview block diagram of a preferred data compression system.

FIG. 1 is an overview block diagram of the data compression system. The compressor 101 receives an input stream and outputs a compressed stream. The decompressor 102 receives a compressed stream and outputs a decompressed stream. In a preferred embodiment, the compressor and decompressor are implemented on a computer system comprising a central processing unit, memory, and input/ output devices. In alternate embodiments, the compressor and decompressor are implemented using a special purpose computer system or using discrete logic. The compressor and decompressor may be used to compress and decompress various types of data including data stored in memory, stored on disk, or transmitted on a communications channel.

Figure 2:
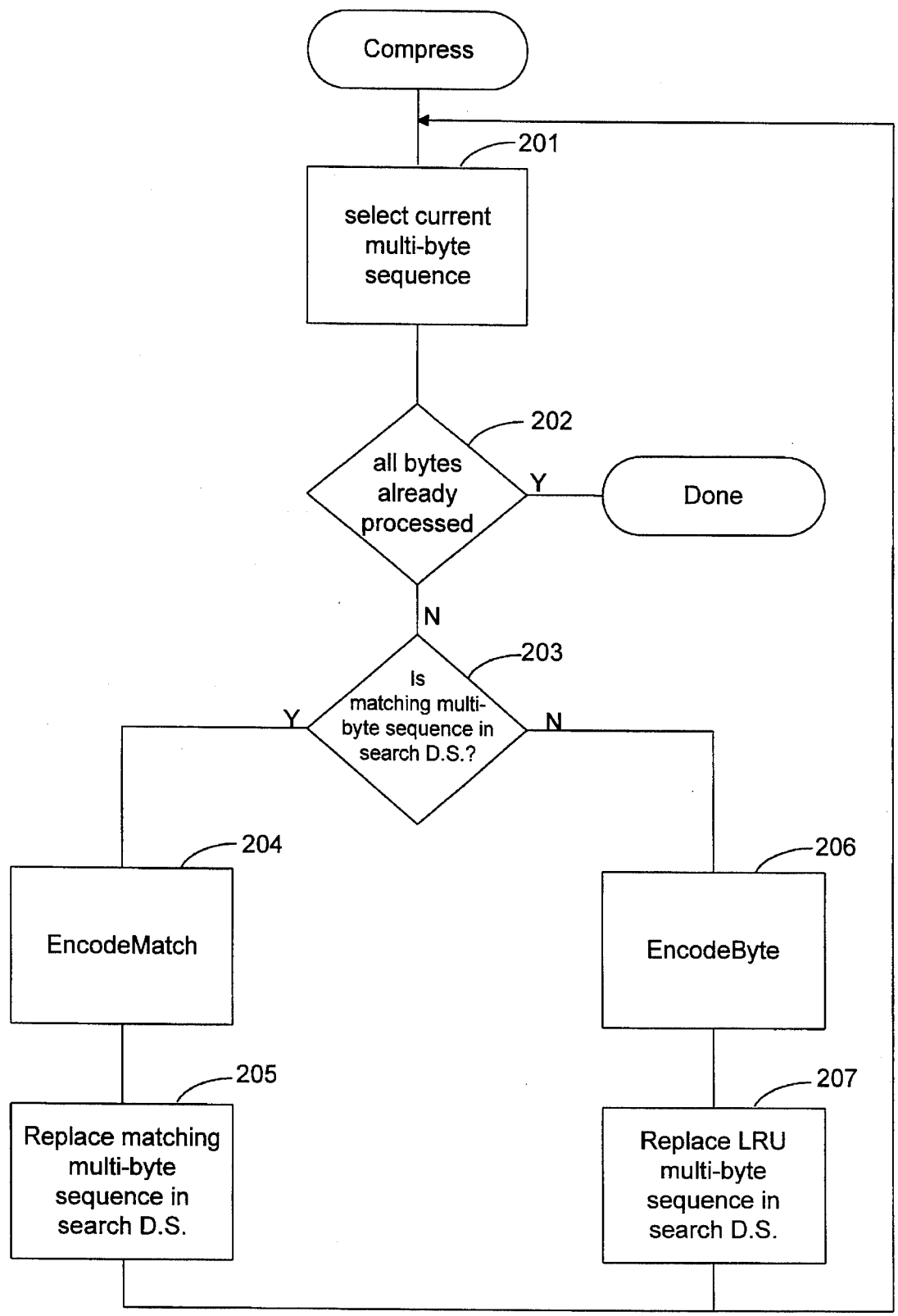
FIG. 2 is an overview flow diagram of a preferred compression system.

FIG. 2 is an overview flow diagram of a preferred compression system. The compression system loops executing steps 201 through 207 to compress the input stream. In step 201, the compression system selects a current byte sequence from the input stream. In step 202, if all the bytes in the input stream have already been processed, then the compression is complete, else the compression system continues at step 203. In step 203, if the search data structure contains an entry that identifies a previously processed byte sequence that matches the current byte sequence, then the compression system continues at step 204, else the compression system continues at step 206. In step 204, the compression system encodes the current byte sequence as a pointer (offset and length) to the matching byte sequence. The compression system preferably determines the maximum length of the match by comparing bytes following the current byte sequence to bytes following the matching byte sequence. In step 205, the compression system replaces the entry in the search data structure that identifies the matching byte sequence with an entry that identifies the current byte sequence and loops to step 201. In step 206, the compression system encodes the first byte of the current byte sequence as a single byte. In step 207, the compression system selects an entry that was least recently updated and replaces the selected entry with an entry that identifies the current byte sequence and loops to step 201.

Figure 3:
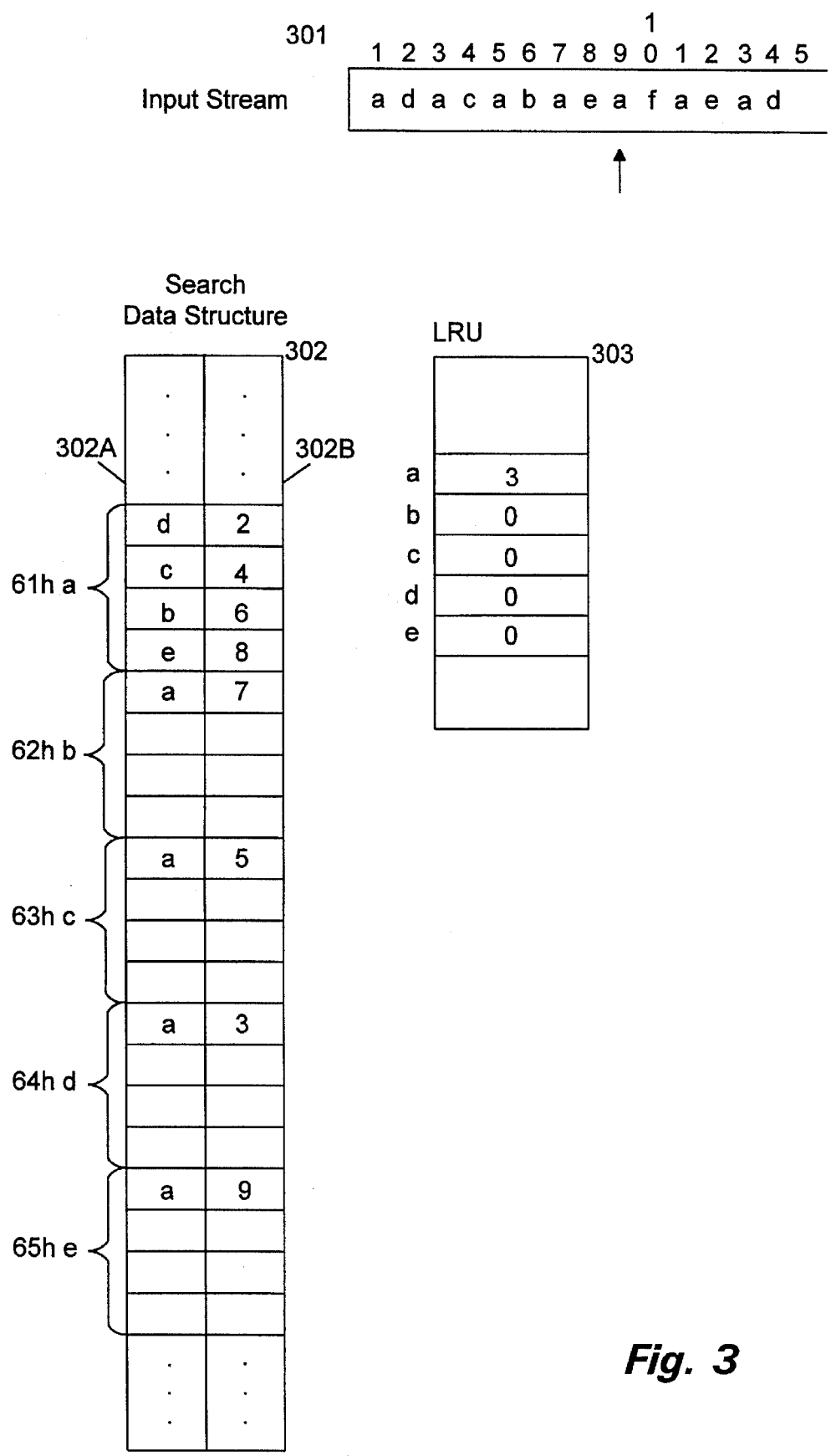
FIG. 3 is a block diagram illustrating a sample search data structure in a preferred embodiment.

FIG. 3 is a block diagram illustrating a sample search data structure in a preferred embodiment. The input stream 301 contains a stream of input data comprising bytes representing letters. The number above each letter in the input stream 301 indicates the position of the letter within input stream 301. For example, the letter "f" is at the tenth position within the input 301. The search data structure 302 is a multi-stream dimensional direct address table that contains an entry for each possible byte-value. Thus, when a byte contains 8 bits, the table contains 256 entries. For example, the byte-value for ASCII "a" is 61 h. The entry indexed by 61 h contains search information relating to byte sequences that begin with an ASCII "a" or byte-value 61 h. Each entry contains a number of slots. A slot contains information that identifies a previous occurrence of a byte sequence in the input stream 301. In the example of FIG. 3, each entry contains four slots. In a preferred embodiment, each entry contains eight slots. In an alternate embodiment, each entry has a variable number of slots based on the expected frequency of the byte-value in an input stream. One skilled in the art would appreciate that by using more slots, a greater amount of compression can be achieved, but generally at the expense of a greater time of compression. When an entry contains four slots, the search data structure can contain information for four byte sequences that begin with the indexed byte-value. Each slot contains a next byte field 302A and a position field 302B. The next byte field contains the byte-value of the next byte after the indexing byte. The position field contains the position of the next byte in the input stream. One skilled in the art would appreciate that a next byte field is included to speed searching. The byte-value of the next byte could be obtained by using the position field as an index into the input stream.

As shown in FIG. 3, the search data structure 302 contains information on the previous byte sequences when the current byte sequence starts at the ninth position in the input stream 301 as indicated by the arrow. The first eight bytes of the input stream 301 contain no matching byte sequences. The search data structure entry for "a" contains a slot that identifies each of the four previous byte sequences that begin with an "a", that is, "ad", "ac", "ab", and "ae." When the current byte sequence, "af" at positions 9 and 10, is processed, the search data structure 302 is searched to determine whether an "af" is identified as a previous byte sequence. In this example, no slot for the entry indexed by "a" contains an "f" as the next byte-value. Consequently, the compression system overwrites the slot for the letter "a" that has been least recently updated. In this case, the slot identifying the byte sequence "ad" is replaced with information to identify the current byte sequence "af". Specifically, the next byte field is overwritten with an "f" and the position field is overwritten with a 10. When the next byte sequence beginning with an "a" is encountered, "ae" at position 11, the compression system searches for a slot in the entry indexed by "a" identifying a match, that is, a previous byte sequence "ae". Since the fourth slot contains an "e", a match is found. The compression system encodes the current byte sequence "ae" as a pointer to the matching byte sequence "ae" and replaces the position in the slot with position 12 to identify the current byte sequence.

The LRU data structure 303 contains an entry for each byte-value and is indexed by the byte-value. The entries identify the least recently updated slot for the corresponding entry in the search data structure. The LRU structure (as shown) actually contains the slot number (0 . . . 3) of the most recently updated slot. The least recently updated slot is obtained by adding 1 to the value in the LRU entry. For example, the least recently updated slot for "a" is slot 0; so the LRU data structure contains a 3(3+1 mod 4=0). When the current byte sequence does not match any byte sequence in the search data structure, the LRU is updated to point to the next slot (in a circular fashion) and the next slot is overwritten with the first byte and position of the current byte sequence. One skilled in the art would appreciate that an estimate of a least recently updated slot can be made by selecting the slot with the smallest position value and thus making the LRU data structure unnecessary.

In alternate embodiments, the byte sequence can be any number of bytes. The search data structure could be implemented as a direct access table indexed by two bytes and thus having $2^{16}$ entries. Alternatively, the search data structure could be implemented as a hash table. When a hash table is used, byte sequences with different first bytes could hash to the same entry causing a collision. When a collision occurs, the first byte of each byte sequence identified by a slot would need to be checked to determine a match. In another embodiment, the slots for each entry could be maintained as a linked list. The linked list could be implemented as an array parallel to the input stream with a slot for each byte in the input stream. Each entry in the search data structure would point to a linked list of slots identifying next byte values. The slots in the linked list would link together next byte values for the same first byte. When searching the linked list, only a certain number of slots are checked for a match. When no match is found, a new slot is added to the beginning of the linked list to identify the current byte sequence. When a matching slot is found, it is preferably removed from the linked list and a new slot added to the beginning of the linked list to identify the current byte sequence.

The preferred encoding (MRCF encoding) specifies that compressed data is encoded according to an LZ77-based scheme that encodes single bytes and matching byte sequences. Matching byte sequences are encoded as a pointer (<offset, length>) that refers to a previous matching byte sequence within the uncompressed data.

Single bytes are encoded with a two bit prefix and the seven least significant bits of the byte. The two bit prefix indicates a single byte encoding and whether the single byte is greater than 127 or less than or equal to 127. Matching byte sequence encoding includes a 2- or 3-bit prefix followed by an offset and the length of the matching byte sequence. The offset is represented by 6, 8, or 12 bits as indicated by the prefix. A 6-bit offset is used to point to byte sequences at offsets between 1 and 63 ($2^6$–1); an 8-bit offset is used to point to byte sequences at offsets between 64 ($2^6$) and 319 ($2^6+2^8$–1); and a 12-bit offset is used to point to byte sequences at offsets between 320 ($2^6+2^8$) and 4144 ($2^6+2^8+2^{12}$–2).

An offset of 0 is invalid. If an offset of 0 is encountered when decoding, it indicates that some damage has occurred to the encoded data stream, possibly as a result of hardware or software error.

MRCF encoding specifies that an "end of sector" (EOS) pattern is included in the compressed stream after each group of 512 bytes of uncompressed data. MRCF encoding also specifies that an EOS pattern is included at the end of the compressed stream. Thus, if the compressed stream does not already have an EOS pattern at its end due to a sector boundary, an EOS pattern is added to the end of the compressed stream. The EOS pattern is a sequence of 15 bits set to 1. The EOS pattern looks like a matching byte sequence encoding with an offset of 4415 ($2^6 2^8+2^{12}$–1) with no length field.

The MRCF encodings for single bytes and matching byte sequences are shown in Table A.

MRCF encoding specifies that the lengths are encoded in a variable number of bits according to the "gamma prime" encoding of Table B.

TABLE A

Single Byte and Matching Byte Sequence

| Format | Meaning |
|---|---|
| xxxxxx00 | Match with a 6-bit offset (0 . . . 63) |
| xxxxxxx01 | Single byte (0 . . . 127) |
| xxxxxxx10 | Single byte (128 . . . 255) |
| xxxxxxx011 | Match with an 8-bit offset (64 . . . 319) |
| xxxxxxxxxxx111 | Match with a 12-bit offset (320 . . . 4414) |
| 111111111111111 | EOS pattern (looks like offset = 4415) |

TABLE B

Gamma Prime Encoding

| Encoding | Length |
|---|---|
| 1 | 2 |
| 010 | 3 |
| 110 | 4 |
| 00100 | 5 |
| 01100 | 6 |
| 10100 | 7 |

TABLE B-continued

Gamma Prime Encoding

| Encoding | Length |
|---|---|
| 11100 | 8 |
| 0001000 | 9 |
| 0011000 | 10 |
| 0101000 | 11 |
| 0111000 | 12 |
| 1001000 | 13 |
| 1011000 | 14 |
| 1101000 | 15 |
| 1111000 | 16 |
| 000010000 | 17 |
| . . . | |
| 111110000 | 32 |
| 00000100000 | 33 |
| . . . | |
| 1111110000 | 64 |
| 0000001000000 | 65 |
| . . . | |
| 1111111000000 | 128 |
| 000000010000000 | 129 |
| . . . | |
| 111111110000000 | 256 |
| 00000000100000000 | 257 |
| . . . | |
| 111111111100000000 | 512 |

Figure 4:
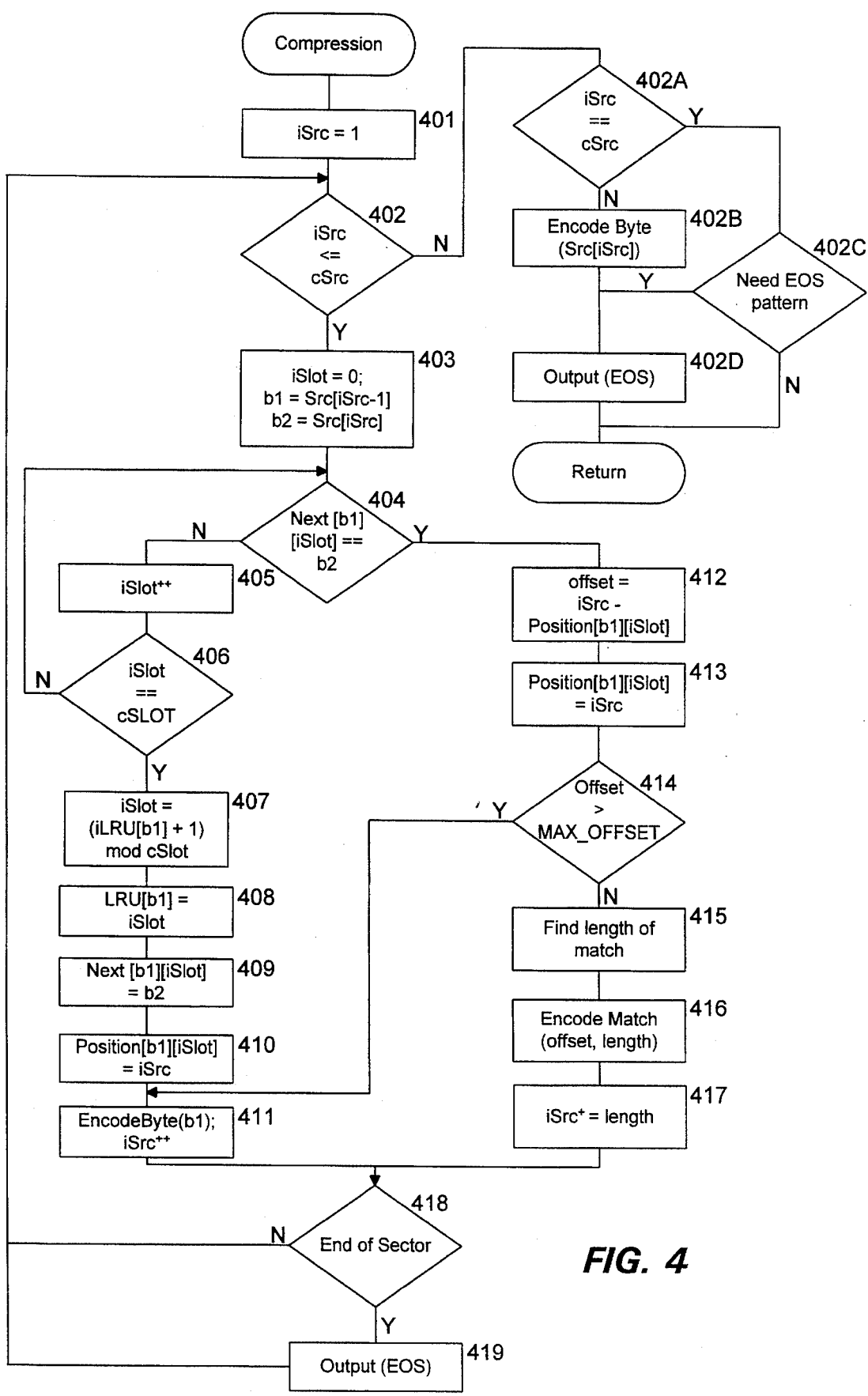
FIG. 4 is a flow diagram of the function Compress.

In one embodiment of the present invention, the functions Compress, EncodeMatch, EncodeByte, and Decompress, as described below, are invoked by the compression and decompression system. FIG. 4 is a flow diagram of function Compress. The function is passed the input stream and outputs a compressed stream. The function is passed the input data stream stored in parameter array Src and the count of the number of bytes in the input stream in parameter count cSrc. In a preferred embodiment, the array Src contains 8192 entries. However, one skilled in the art would appreciate that array of other sizes could be used. The function maintains, as the search data structure, two multidimensional arrays, one corresponding to the next byte field (Next[256][8]) and the other corresponding to the position field (Position[256][8]). The arrays have 256 entries each corresponding to each byte-value combination in a 8-bit byte. Each entry contains eight slots. In a preferred embodiment, the function initializes each slot to contain an infrequently encountered byte-value in the next field and a very large negative number in the position field. The very large negative number ensures that its offset from the current byte sequence will be larger than the maximum allowable offset and thus will not be encoded as a byte sequence. The function also maintains the array LRU, which contains an entry for each byte-value. Each entry contains the slot number of the corresponding entry in the array Next and Position that were most recently updated after no match was found. The function preferably initializes each entry in the LRU array to point to the last slot (e.g., 7). Alternatively, each entry could be initialized to contain a number outside the range of slot numbers, such as a –1. When an LRU entry contains a –1, then the function suppresses searching the slots for a match. The function outputs a single byte encoding, updates slot number 0, and sets the LRU entry to 0. In step 401, the function initializes index iSrc to 1. Index iSrc is an index into array Src. In the following, the arrays are assumed to be indexed starting at 0. In step 402, if index iSrc is less than or equal to count cSrc, then the function continues at step 403, else the function continues at step 402A. In step 402A, if the index iSrc equals the count cSrc, then the last byte in array Src has not yet been encoded and the function continues at step 402B, else the function continues at step 402C. In step 402B, the function encodes the last byte in the array Src. In step 402C, if an EOS pattern has not yet been output at the end of the compressed stream, then the function continues at step 402D, else the function returns. In step 402D, the function outputs an EOS pattern and returns. In step 403, the function initializes index iSlot and byte-values b1 and b2. The index iSlot is used to search the slots for a particular byte-value. The byte-value b1 contains the first byte of the current byte sequence, and byte-value b2 contains the second byte of the current byte sequence. In step 403, the function initializes index iSlot to 0, byte-value b1 to the byte at index iSrc minus 1 of array Src, and byte-value b2 to the byte at index iSrc of array Src. In steps 404 through 406, the function loops searching for a previous occurrence of a matching byte sequence. In step 404, if the slot in array Next indexed by byte-value b1 and by index iSlot is equal to byte-value b2, then a two-byte match is found and the function continues at step 412, else the function continues at step 405. In step 405, the function increments the index iSlot. In step 406, if the index iSlot is equal to the count cSLOT, then all the slots for the entry indexed the byte-value b1 have been checked and no matching previous byte sequence has been found, and the function continues at step 407, else the function loops to step 404. The count cSLOT contains the number of slots in an entry. In step 407, the function sets index iSlot equal to the modulo of the slot number indexed by byte-value b1 in array LRU plus 1 and the count cSLOT. In step 408, the function updates the entry of array LRU indexed by byte-value b1 to contain the next slot. In step 409, the function updates the entry of array Next indexed by byte-value b1 and by index iSlot to contain the byte-value b2. In step 410, the function updates the entry of array Position indexed by byte-value b1 and by index iSlot to contain the position of byte-value b2 in the current byte sequence, that is, index iSrc. In step 411, the function encodes the byte-value b1 and increments index iSrc to point to the next byte in the input stream and continues at step 418. In steps 412 through 417, the compression system processes a match. In step 412, the compression system sets the variable offset equal to the difference between the position of the current byte sequence and the position of the matching byte sequence. In step 413, the function overwrites the position of the matching byte sequence in array Position with the position of the current byte sequence indicated by index iSrc. In step 414, if the variable offset is greater than the maximum allowable offset (as defined by the encoding scheme), then the function continues at step 411, else the function continues at step 415. In an alternate embodiment, when an offset is greater than the maximum allowable offset, the least recently updated slot is replaced rather than the slot corresponding to the matching entry. In step 415, the function determines the maximum length of the match. The maximum length of the match is determine by comparing bytes following the current two-byte sequence with bytes following the matching two-byte sequences. The function ensures that the length does not extend across a sector boundary. If the first byte of the current byte sequence is at a sector boundary, then a single byte encoding is output (not shown in FIG. 4). In step 416, the function encodes the match by invoking function EncodeMatch. In step 417, the function updates the index iSrc to index the second byte after the maximum match length of the current byte sequence. In step 418, if the end of a sector is reached, then the function continues at step 419, else the function loops to step 402. In step 419, the function outputs an EOS pattern and loops to step 402.

Figure 5:
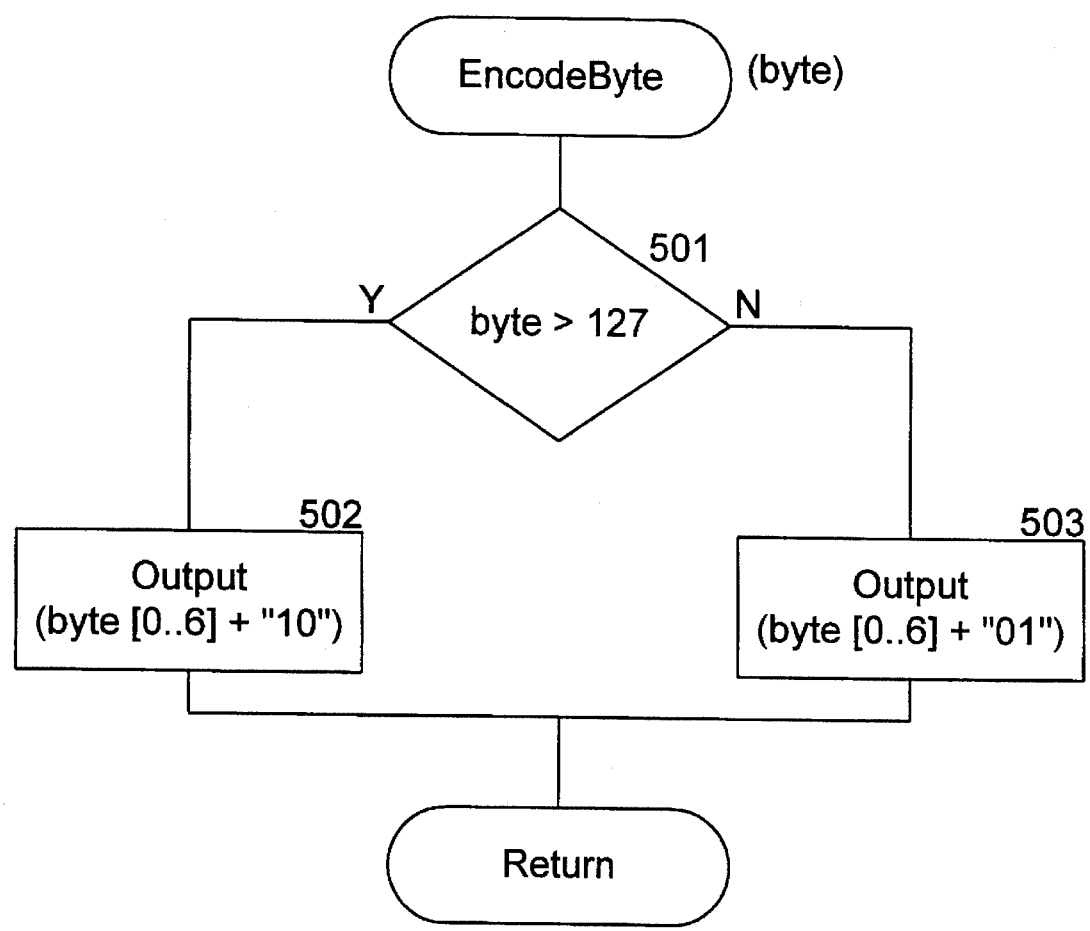
FIG. 5 is a flow diagram of the function EncodeByte.

FIG. 5 is a flow diagram of the function EncodeByte. The function EncodeByte is passed a byte value to encode and outputs to the compressed stream the byte-value in accordance with MRCF encoding. In step 501, if the value of the passed byte is greater than 127, then the function continues at step 502, else the function continues at step 503. In step 502, the function outputs to the compressed stream the least significant seven bits of the passed byte plus a "10" to indicate a byte of greater than 127 and returns. In step 503, the function outputs to the compressed stream the least significant seven bits of the passed byte and a "01" to indicate a byte of 127 or less and returns.

Figure 6:
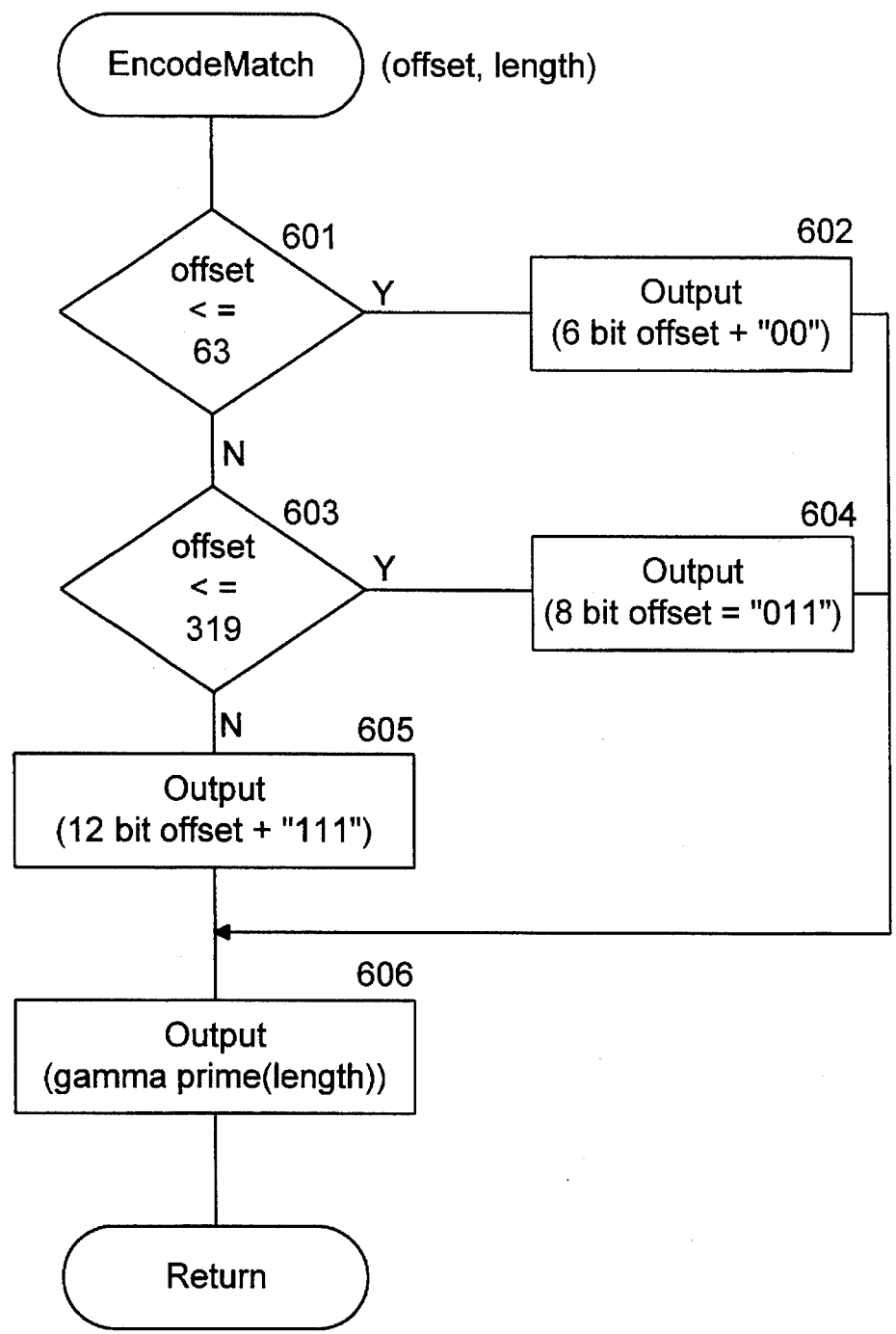
FIG. 6 is a flow diagram of the function EncodeMatch.

FIG. 6 is a flow diagram of the function EncodeMatch. The function is passed the offset and length to encode. In step 601, if the offset is less than or equal to 63, then the function outputs a 6-bit offset plus the prefix in step 602 and continues to step 606, else the function continues at step 603. In step 603, if the offset is less than or equal to 319, then the function outputs an 8-bit offset plus the prefix in step 604 and continues at step 606, else the function continues at step 605. In step 605, the function outputs a 12-bit offset plus the prefix. In step 606, the function outputs the gamma prime encoding of the length and returns.

Figure 7:
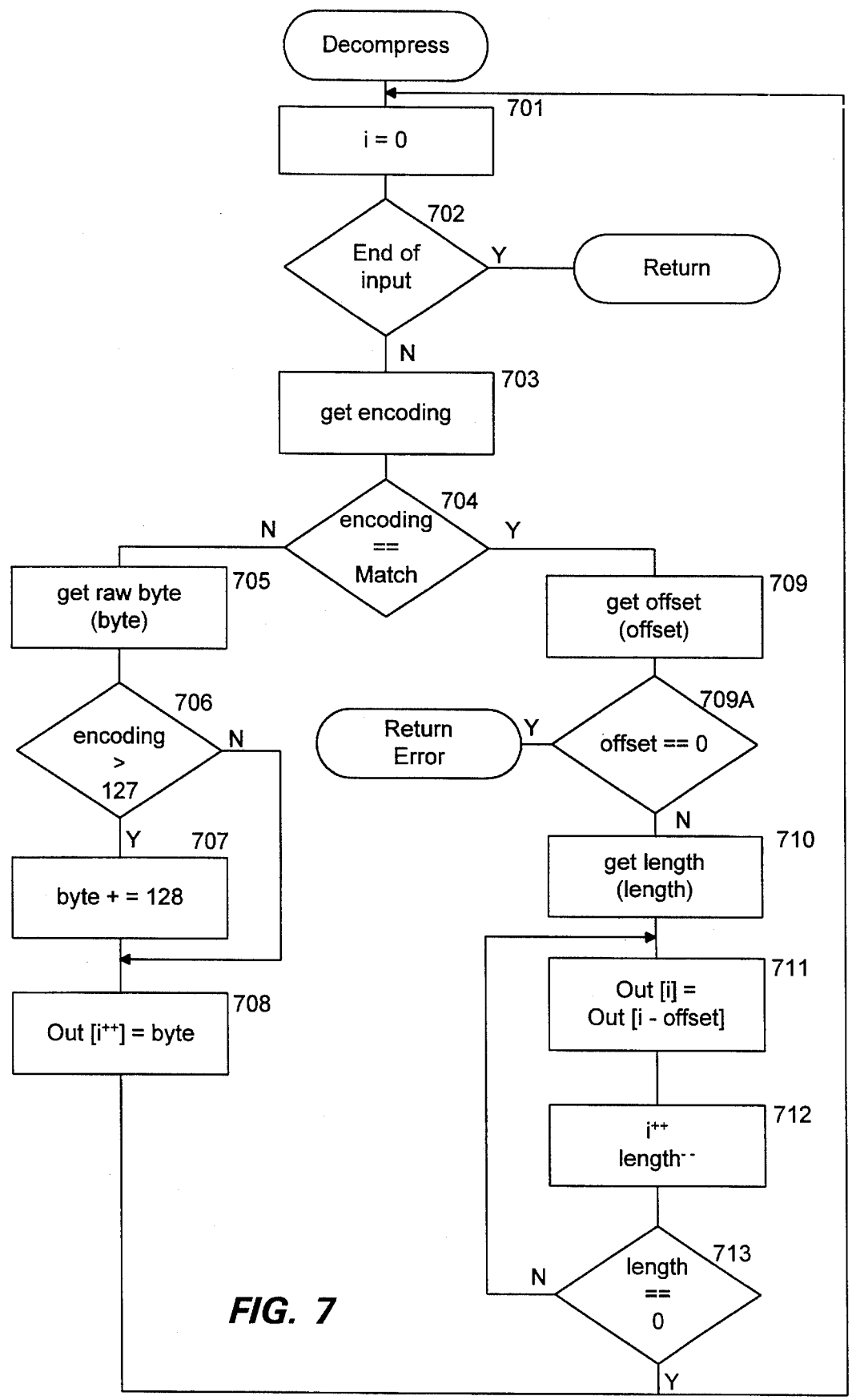
FIG. 7 is a flow diagram of the function Decompress.

FIG. 7 is a flow diagram of the function Decompress. The function is passed a compressed stream that is MRCF encoded and outputs a decompressed stream. In step 701, the function sets the index i equal to 0. The index i is the index into the decompressed stream stored in array Out. In step 702, if the end of the compressed stream is reached, then the function returns, else the function continues at step 703. In step 703, the function retrieves the next two bits of from the compressed stream. In step 704, if the retrieved two bits indicate a match encoding, then the function continues at step 709, else the function continues at step 705. In steps 705 through 708, the function decodes a single byte encoding. In step 705, the function retrieves the next seven bits of the compressed stream as the retrieved byte. In step 706, if the retrieved two bits indicate that the retrieved byte is greater than 127, then the function adds 128 to the retrieved byte in step 707, else the function continues at 708. In step 708, the function sets the byte indexed by index i in array Out equal to the retrieved byte and increments index i and loops to step 702. In step 709, the function retrieves the encoded offset from the compressed stream. In step 709A, if the encoded offset is equal to zero, then an error in the compressed stream is detected and the function returns, else the function continues at step 710. In step 710, the function retrieves the encoded length from the compressed stream. In steps 711 through 713, the function loops, copying the byte sequence of array Out starting at index i minus the variable offset and continuing for the variable length number of bytes to array Out starting at index i. In step 711, the function sets the byte of array Out indexed by index i equal to the byte of array Out indexed by index i minus the variable offset. In step 712, the function increments the index i and decrements the variable length. In step 713, if the variable length is equal to 0, then the copy is complete and the function loops to step 702, else the function loops to step 711 to continue the copying.

Although the present has been described in terms of a preferred embodiment, it is not intended that the invention be limited to this embodiment. Modifications within the spirit of the invention will be apparent to those skilled in the art. The scope of the present invention is defined by the claims which follow.

We claim:

1. A method of compressing a stream of bytes in a compression system, each byte having a position within the stream, the compression system having a search data structure containing an entry for each byte value, each entry having a plurality of slots, each slot for identifying the position of an occurrence of a byte sequence, the method comprising the steps of:

retrieving a byte sequence from the stream;

determining whether the search data structure contains a slot identifying the position of a byte sequence that matches the retrieved byte sequence
by selecting an entry corresponding to one of the byte values in the retrieved byte sequence, and
by searching the slots of the selected entry to determine whether the byte sequence identified by the slot matches the retrieved byte sequence, when the search data structure contains such a slot, replacing the position contained in the slot with the position of the retrieved byte sequence; and when the search data structure does not contain such a slot, selecting a least recently updated slot of the selected entry and replacing the position contained in the selected slot with the position of the retrieved byte sequence.

2. The method of claim 1 wherein the compression system includes a least recently updated data structure, the least recently updated data structure having an entry corresponding to each entry of the search data structure, and including the additional step of when the search data structure does not contain such a slot, updating the corresponding entry of the least recently updated data structure to identify the least recently updated slot.

3. A method of compressing a stream of bytes in a compression system, each byte having a position within the stream, the compression system having a search data structure with slots for identifying the position of occurrences of byte sequences, the method comprising the steps of:

retrieving a byte sequence from the stream;

determining whether the search data structure contains a slot identifying the position of a byte sequence that matches the retrieved byte sequence;

When the search data structure contains such a slot, replacing the position contained in the slot with the position of the retrieved byte sequence and outputting an indicator of the position identified in the slot; and when the search data structure does not contain such a slot, selecting a least recently updated slot and replacing the position contained in the selected slot with the position of the retrieved byte sequence and outputting a byte of the retrieved byte sequence.

4. A method in a compression system of compressing a stream of bytes, each byte having a position within the stream, the compression system having a search data structure with slots for identifying the position of occurrences of byte sequences, the method comprising the steps of:

retrieving a byte sequence from the stream;

determining whether the search data structure contains a slot identifying the position of a byte sequence that matches the retrieved byte sequence; and when the search data structure contains such a slot,
when the offset between the position contained in the slot and the position of the retrieved byte sequence is greater than a maximum allowable offset, selecting a least recently updated slot and replacing the position contained in the selected slot with the position of the retrieved byte sequence; and when the offset between the position contained in the slot and the position of the retrieved byte sequence is not greater than a maximum allowable offset, replacing the position contained in the identifying slot with the position of the retrieved byte sequence.

5. The method of claim 4 including the step of when the search data structure does not contain such a slot, selecting a least recently updated slot and replacing the position contained in the selected slot with the position of the retrieved byte sequence.

6. The method of claim 4 or 5 including the steps of:

when replacing the position contained in the selected slot, outputting a byte of the retrieved byte sequence; and when replacing the position contained in the identifying slot, outputting an indicator of the position identified in the slot before being replaced.

7. A method in a data compression system for identifying a previously occurring matching string in an input stream, the previously occurring strings being identified by an identifier and comprising a plurality of characters, the data compression system having a search data structure with a search entry for each possible character, each search entry having a plurality of slots, each slot having an identifier, the method comprising the steps of:

determining whether an identifier identifies a previously occurring string that matches a current string by searching the search entry in the search data structure corresponding to a character of the current string for a slot that contains such an identifier;

when a slot containing the identifier of a matching string is found, replacing the identifier with an identifier of the current string; and when a slot containing the identifier of a matching string is not found, replacing the identifier, in a slot of the search entry corresponding to a character of the current string, that identifies a least recently occurring string with an identifier of the current string.

8. The method of claim 11 including the step of maintaining a least recently updated (LRU) direct access table with an LRU entry containing an indicator of the least recently updated slot in the corresponding search entry.

9. A method of compressing a stream of bytes in a compression system, each byte having a position within the stream, the compression system having a search data structure with slots for identifying the position of occurrences of byte sequences, the method comprising the steps of:

retrieving a byte sequence from the stream;

determining whether the search data structure contains a slot identifying the position of a byte sequence that matches the retrieved byte sequence;

when the search data structure contains such a slot, replacing the position contained in the slot with the position of the retrieved byte sequence; and when the search data structure does not contain such a slot, selecting a least recently updated slot by selecting the slot with the smallest position value and replacing the position contained in the selected slot with the position of the retrieved byte sequence.

10. The method of claim 1 wherein the number of slots comprising each entry is determined by the expected frequency that the byte value used to determine the selection of an entry will occur in a stream of bytes.

11. The method of claim 1 wherein the number of slots comprising each entry is eight.

12. The method of claim 1 wherein the step of selecting an entry corresponding to one of the byte values is performed using the first byte in the retrieved byte sequence as an index corresponding to an entry and the step of searching the slots is performed using the second byte in the retrieved byte sequence as an index corresponding to a slot.

* * * * *